United States Patent
Che

(10) Patent No.: US 7,407,886 B2
(45) Date of Patent: Aug. 5, 2008

(54) METHOD FOR PREPARING A CONTACT PLUG STRUCTURE

(75) Inventor: Hsueh Yi Che, Hualien (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 11/442,259

(22) Filed: May 30, 2006

(65) Prior Publication Data

US 2007/0228460 A1    Oct. 4, 2007

(30) Foreign Application Priority Data

Mar. 29, 2006  (TW) .............................. 95110871 A

(51) Int. Cl.
*H01L 21/44* (2006.01)

(52) U.S. Cl. ..................... 438/672; 438/666; 438/684; 257/E21.585

(58) Field of Classification Search ................ 438/672, 438/666, 684; 257/E21.585
See application file for complete search history.

(56) References Cited

U.S. PATENT DOCUMENTS

| | | | | |
|---|---|---|---|---|
| 5,924,008 A | * | 7/1999 | Michael et al. ............. | 438/647 |
| 6,117,785 A | * | 9/2000 | Lee et al. .................... | 438/700 |
| 6,479,377 B1 | * | 11/2002 | Tang et al. .................. | 438/618 |
| 7,262,127 B2 | * | 8/2007 | Ishikawa .................... | 438/622 |
| 2003/0129840 A1 | * | 7/2003 | Kumar et al. ............... | 438/694 |
| 2006/0286796 A1 | * | 12/2006 | Nagel et al. ................. | 438/640 |

* cited by examiner

*Primary Examiner*—Bradley W. Baumeister
*Assistant Examiner*—Steven J Fulk
(74) *Attorney, Agent, or Firm*—Oliff & Berridge, PLC

(57) ABSTRACT

A contact plug structure for a checkerboard dynamic random access memory comprises a body portion, two leg portions connected to the body portion and a dielectric block positioned between the two leg portions. Each leg portion is electrically connected to a deep trench capacitor arranged in an S-shape manner with respect to the contact plug structure via a doped region isolated by a shallow trench isolation structure. Preferably, the body portion and the two leg portions can be made of the same conductive material selected from the group consisting of polysilicon, doped polysilicon, tungsten, copper and aluminum, while the dielectric block can be made of material selected from the group consisting of borophosphosilicate glass. Particularly, the contact plug can be prepared by dual-damascene technique. Since the overlapped area between the contact plug structure and a word line can be dramatically decreased, the bit line coupling (BLC) can be effectively reduced.

13 Claims, 15 Drawing Sheets

METHOD FOR PREPARING A CONTACT PLUG STRUCTURE

BACKGROUND OF THE INVENTION (A) Field of the Invention

The present invention relates to a contact plug structure and method for preparing the same, and more particularly, to a contact plug structure and method for preparing the same using the dual-damascene technique.

(B) Description of the Related Art

FIG. 1 is a top view of a checkerboard dynamic random access memory 10 according to the prior art, FIG. 2 is close-up solid view of a portion of the checkerboard dynamic random access memory 10 in the dash-lined region, and FIG. 3 shows the equivalent circuit of a portion of the checkerboard dynamic random access memory 10 in the dash-lined region. A contact plug structure 16 is used to electrically connect the bit line 14 of the checkerboard dynamic random access memory 10 to two doped regions 24 and further to two deep trench capacitors arranged in an S-shape manner, as indicated by the S-shaped solid line. Particularly, the two doped regions 24 are positioned at two sides of a word line 20 in an S-shape manner, and a shallow trench isolation structure 22 is used to electrically isolate the doped region 24, as shown in FIG. 2.

The prior art used a single contact plug structure 16 to electrically connect two doped regions 24 positioned at different sides of the bit line 14, and the contact plug structure possesses a very large volume, extending over two doped regions 24 and one shallow trench isolation structure 22 so as to achieve the electrical connection of two doped regions 24 at different sides of the bit line 14. However, the overlapped area between the contact plug structure 16 and the word line 20 is also very large corresponding to the large volume of the contact plug structure 16. The large overlapped area between the word line 20 and the contact plug structure 16 results in serious bit line coupling (BLC), which is an important issue that researchers developing the advanced dynamic random access memory have worked to solve.

SUMMARY OF THE INVENTION

One aspect of the present invention provides a bit line contact plug structure and method for preparing the same using the dual-damascene technique, which can dramatically decrease the overlapped area between the bit line contact plug structure and a word line such that bit line coupling can be effectively reduced.

A contact plug structure for the checkerboard DRAM according to this aspect of the present invention comprises a body portion, two leg portions connected to the body portion and a dielectric block positioned between the two leg portions. Each leg portion connects to a deep trench capacitor via a doped region electrically isolated by a shallow trench isolation structure. Preferably, the body portion and the two leg portions are made of the same conductive material selected from the group consisting of polysilicon, doped polysilicon, tungsten, copper and aluminum, while the dielectric block is made of material selected from the group consisting of borophosphosilicate glass, silicon oxide, fluorinated silicate glass (FSG) and low-k material.

Another aspect of the present invention provides a method for preparing a contact plug structure for the checkerboard DRAM comprising steps of forming a first mask having a plurality of first openings on a substrate including a first dielectric layer and a second dielectric layer positioned on the first dielectric layer, removing a portion of the first dielectric layer and the second dielectric layer under the first openings to form a plurality of first depressions in the first dielectric layer, forming a second mask having a plurality of second openings on the substrate, each second opening connecting a plurality of the first openings, removing a portion of the second dielectric layer under the second openings to form a plurality of second depressions in the second dielectric layer, and depositing a conductive layer in the first depressions and the second depressions to form the contact plug structure. A portion of the conductive layer in the first depressions forms leg portions of the contact plug structure, while another portion of the conductive layer in the second depressions forms the body portions of the contact plug structure.

Conventional contact plug structure possesses a serious bit line coupling due to extension over two doped regions and one shallow trench isolation structure. In contrast, the contact plug structure according to one aspect of the present invention uses two leg portions to electrically connect two doped regions arranged in an S-shape manner with respect to the contact plug structure, and the two leg portions are electrically isolated from each other by a dielectric block. Consequently, the contact plug structure according to one aspect of the present invention can dramatically decrease the overlapped area between the bit line contact plug structure and a word line such that the bit line coupling can be effectively reduced

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
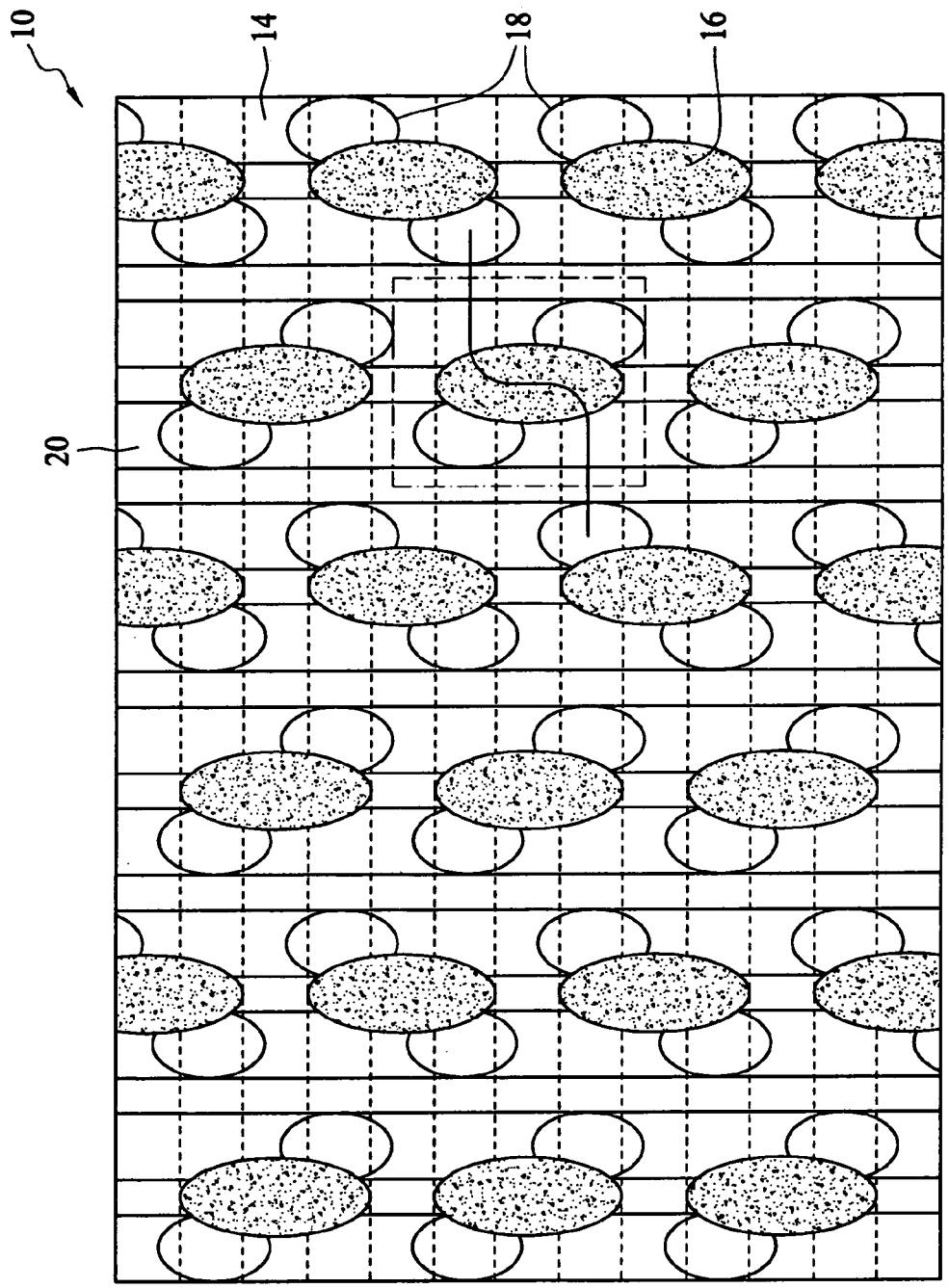
FIG. 1 to FIG. 3 illustrate a checkerboard dynamic random access memory according to one embodiment of the prior art.
Figure 2:
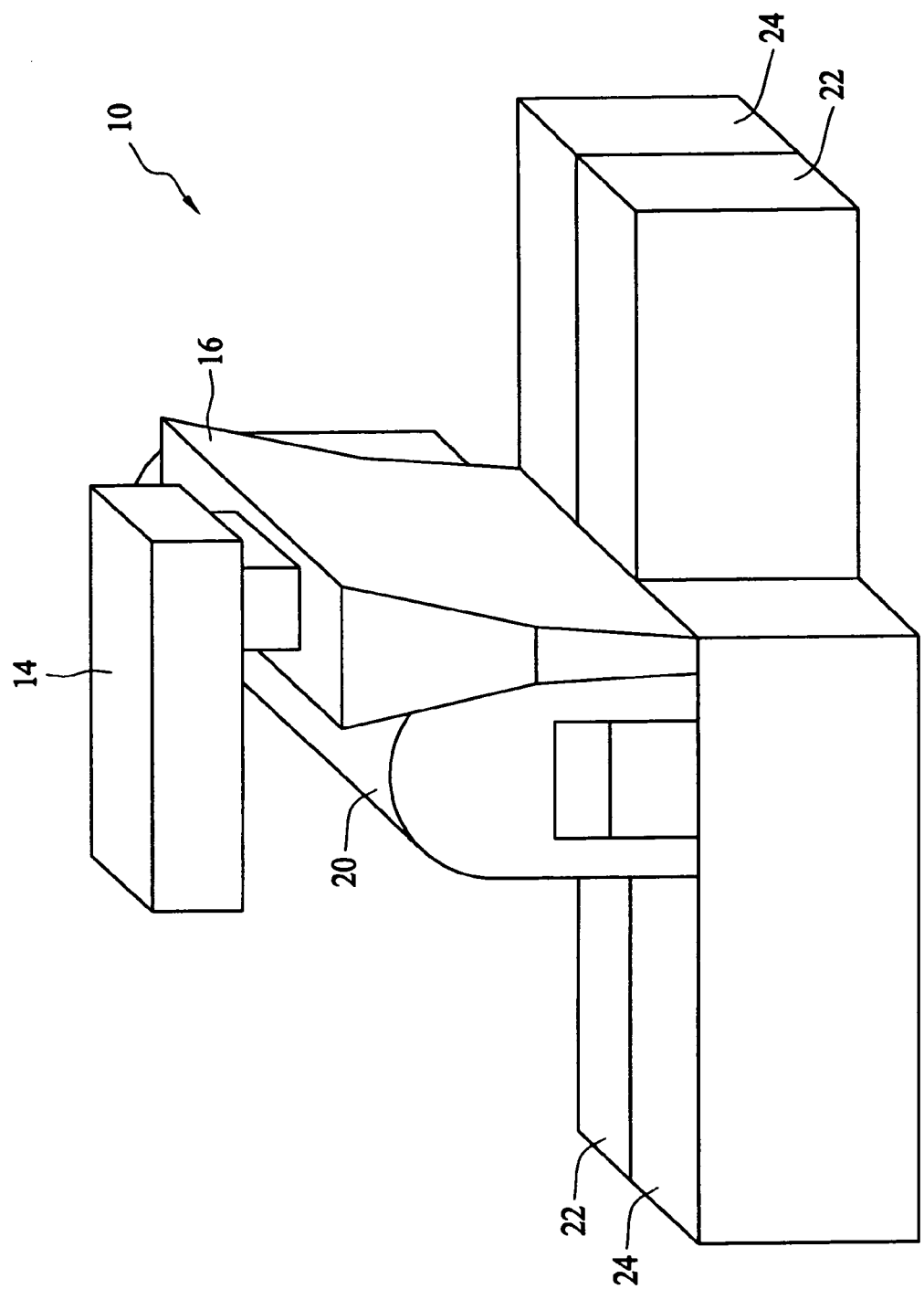
Figure 3:
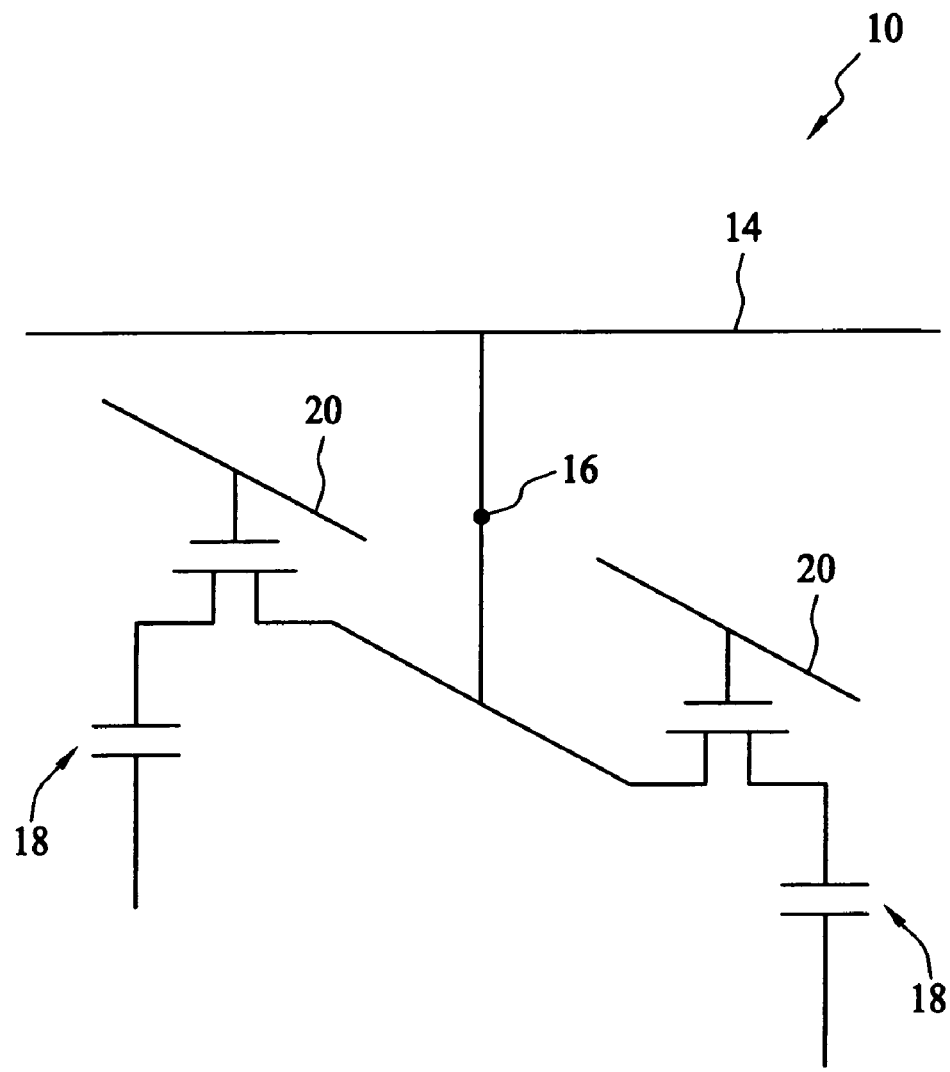
Figure 4:
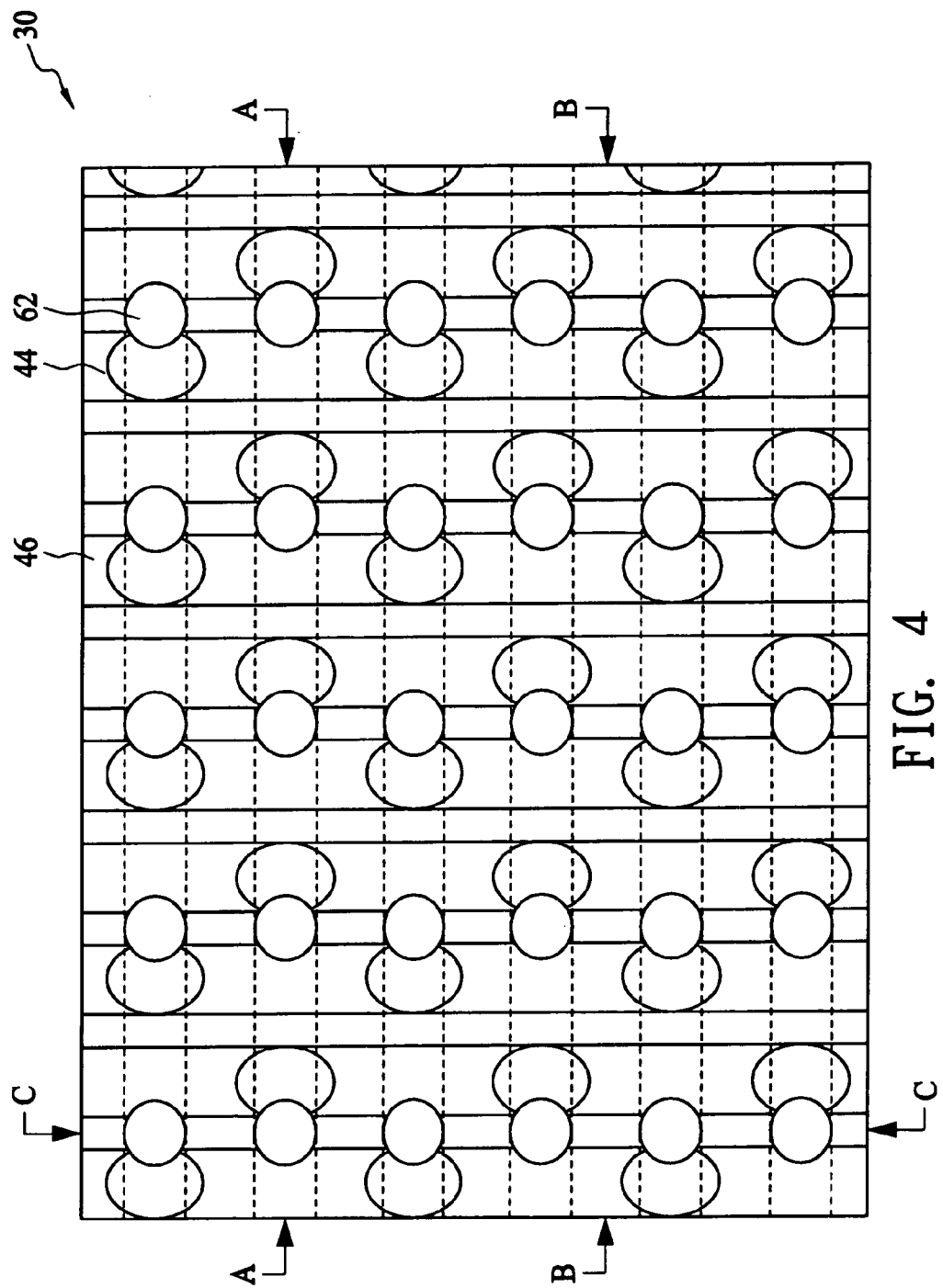
FIG. 4 and FIG. 11 illustrate a method for preparing a contact plug structure for a checkerboard dynamic random access memory according to one embodiment of the present invention.
Figure 5A:
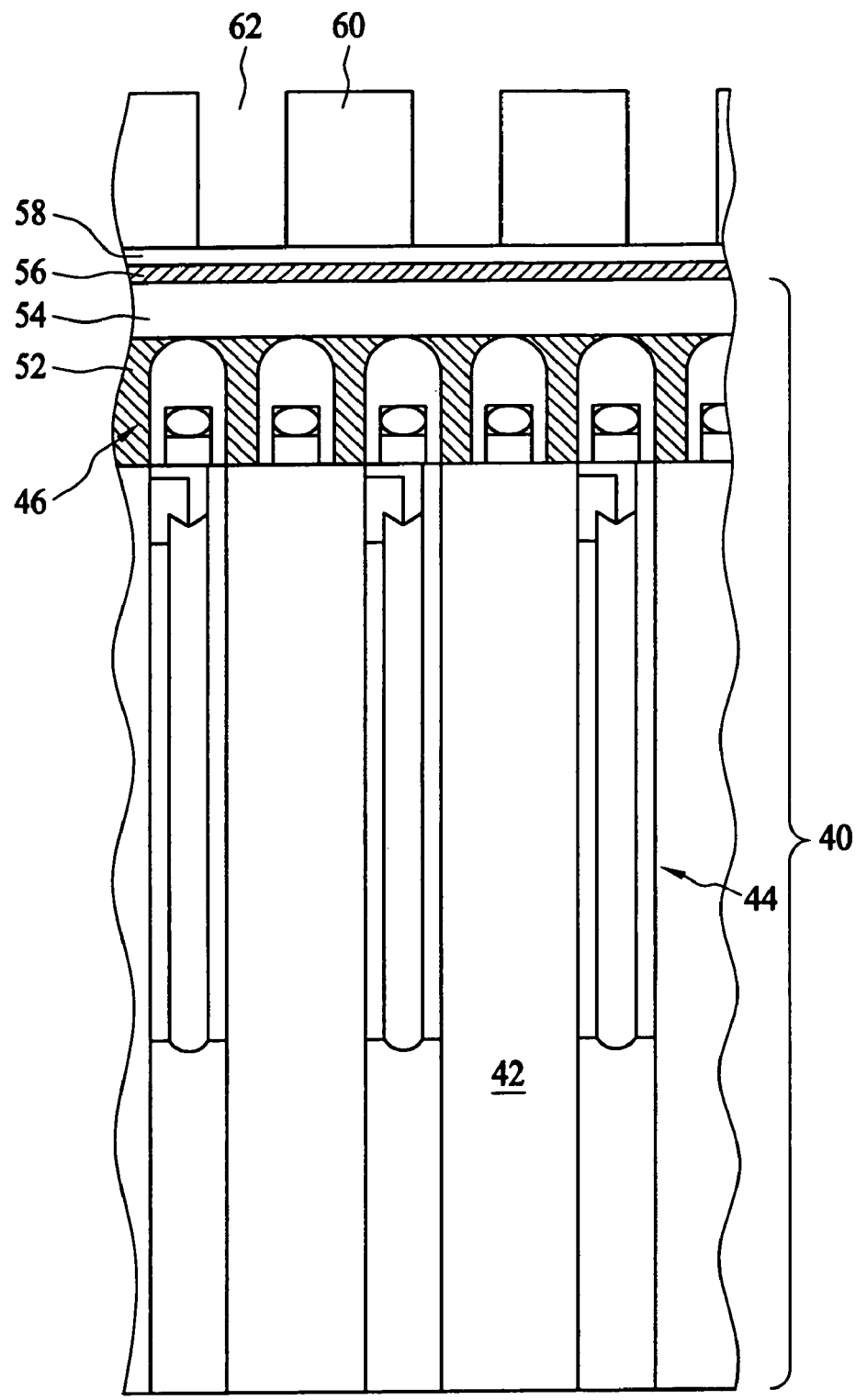
Figure 5B:
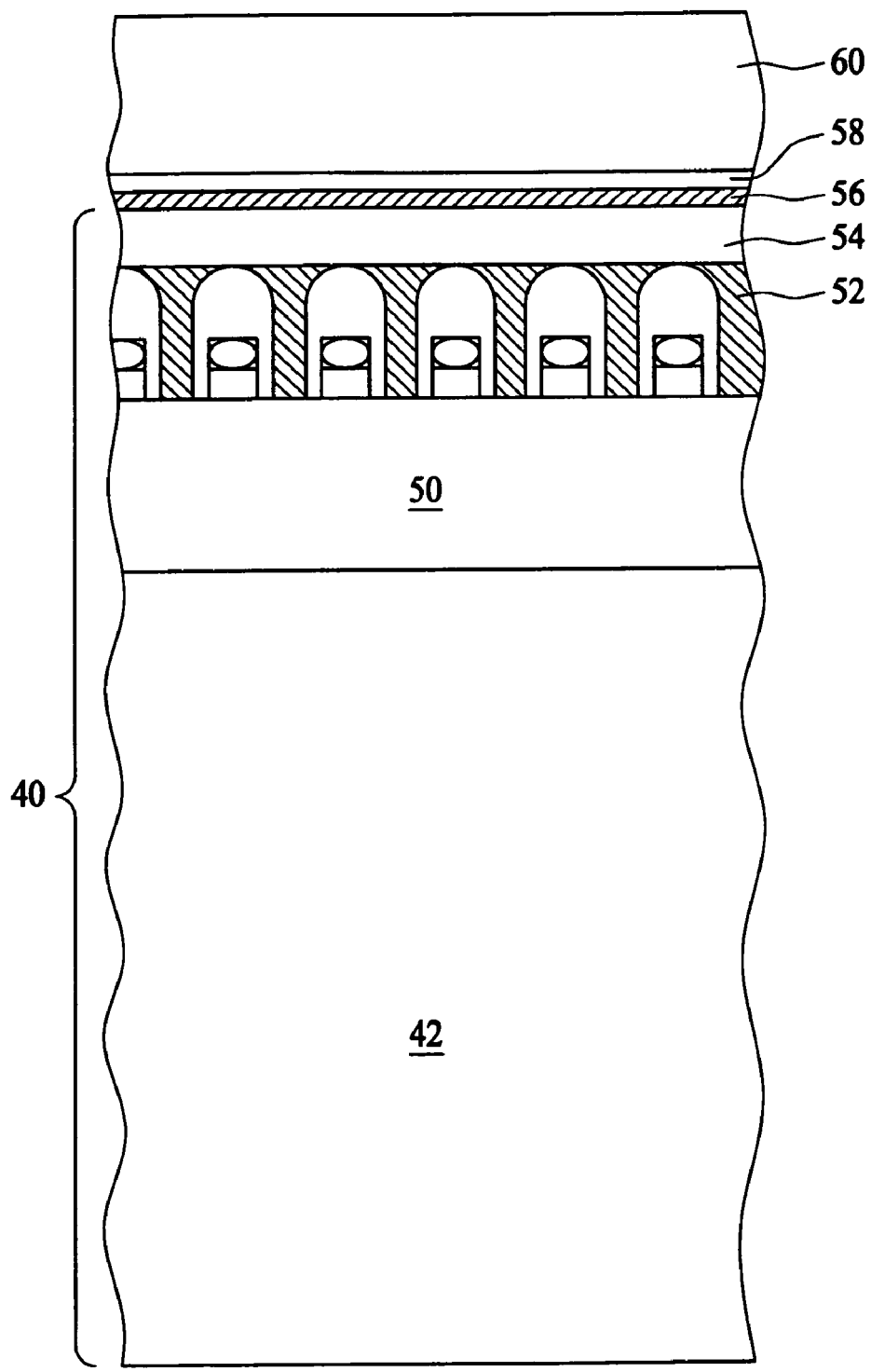
Figure 5C:
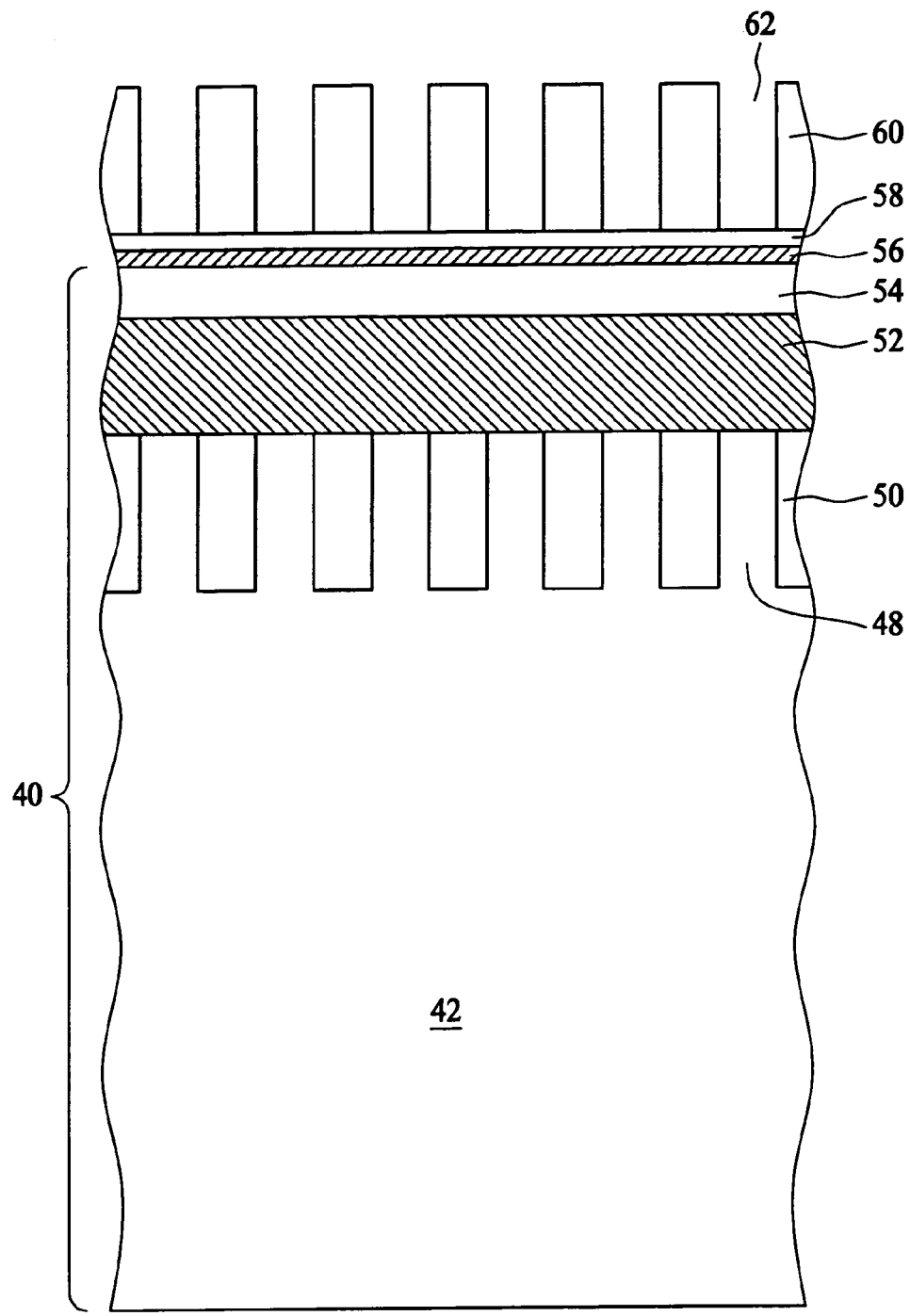
Figure 11:
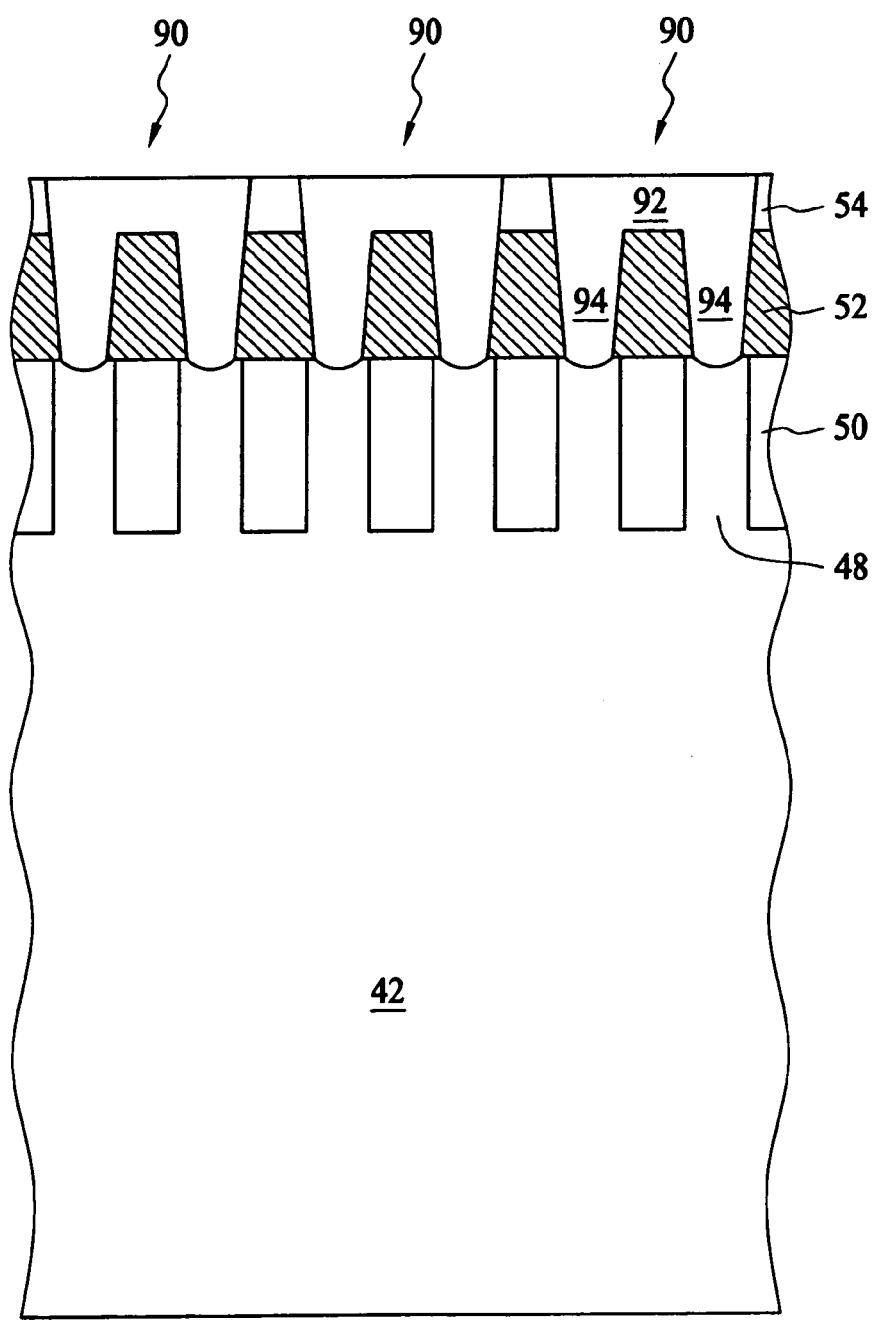

FIG. 4 and FIG. 11 illustrate a method for preparing a contact plug structure 90 for a checkerboard dynamic random access memory 30 according to one embodiment of the present invention. FIG. 4 is a top view of the checkerboard dynamic random access memory 30 at the beginning of the preparing process, FIG. 5(a) is a close-up cross-sectional view of the checkerboard dynamic random access memory 30 along a cross-sectional line A-A in FIG. 4, FIG. 5(b) is a close-up cross-sectional view of the checkerboard dynamic random access memory 30 along a cross-sectional line B-B in FIG. 4, and FIG. 5(c) is a close-up cross-sectional view of the checkerboard dynamic random access memory 30 along a cross-sectional line C-C in FIG. 4.

A polysilicon layer 56 is formed on a substrate 40 including a silicon substrate 42, a plurality of deep trench capacitors 44, a plurality of word lines 46, a first dielectric layer 52 made of borophosphosilicate glass (BPSG), and a second dielectric layer 54 made of material including silane on the first dielectric layer 52. An anti-reflection layer 58 is then formed on the polysilicon layer 56 and a lithographic process is performed to form a photoresist layer 60 having a plurality of openings 62 on the anti-reflection layer 58. Preferably, the anti-reflection layer is made of organic material including methyl-2-hydroxyisobutyrate.

Figure 6:
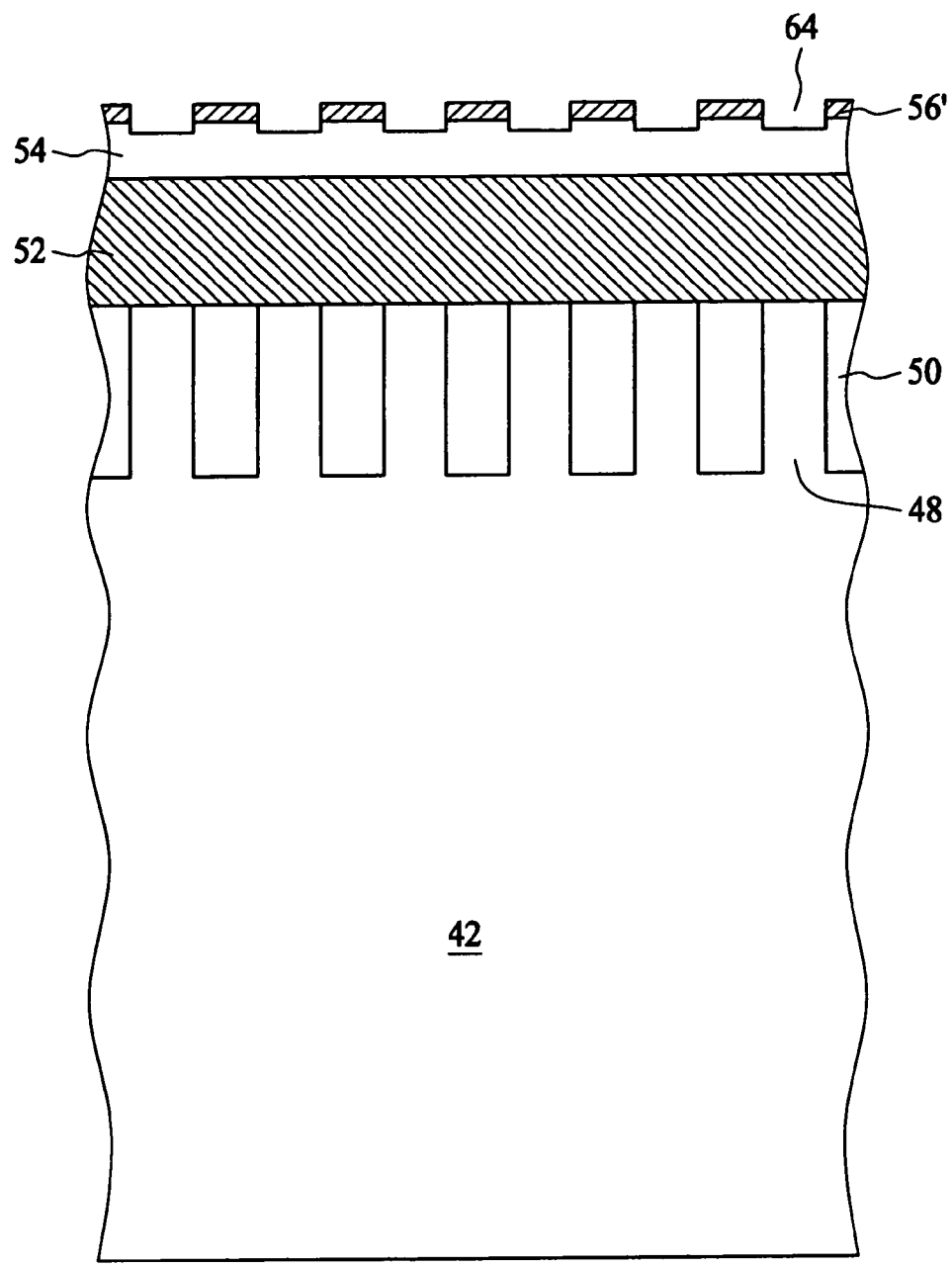
Figure 7:
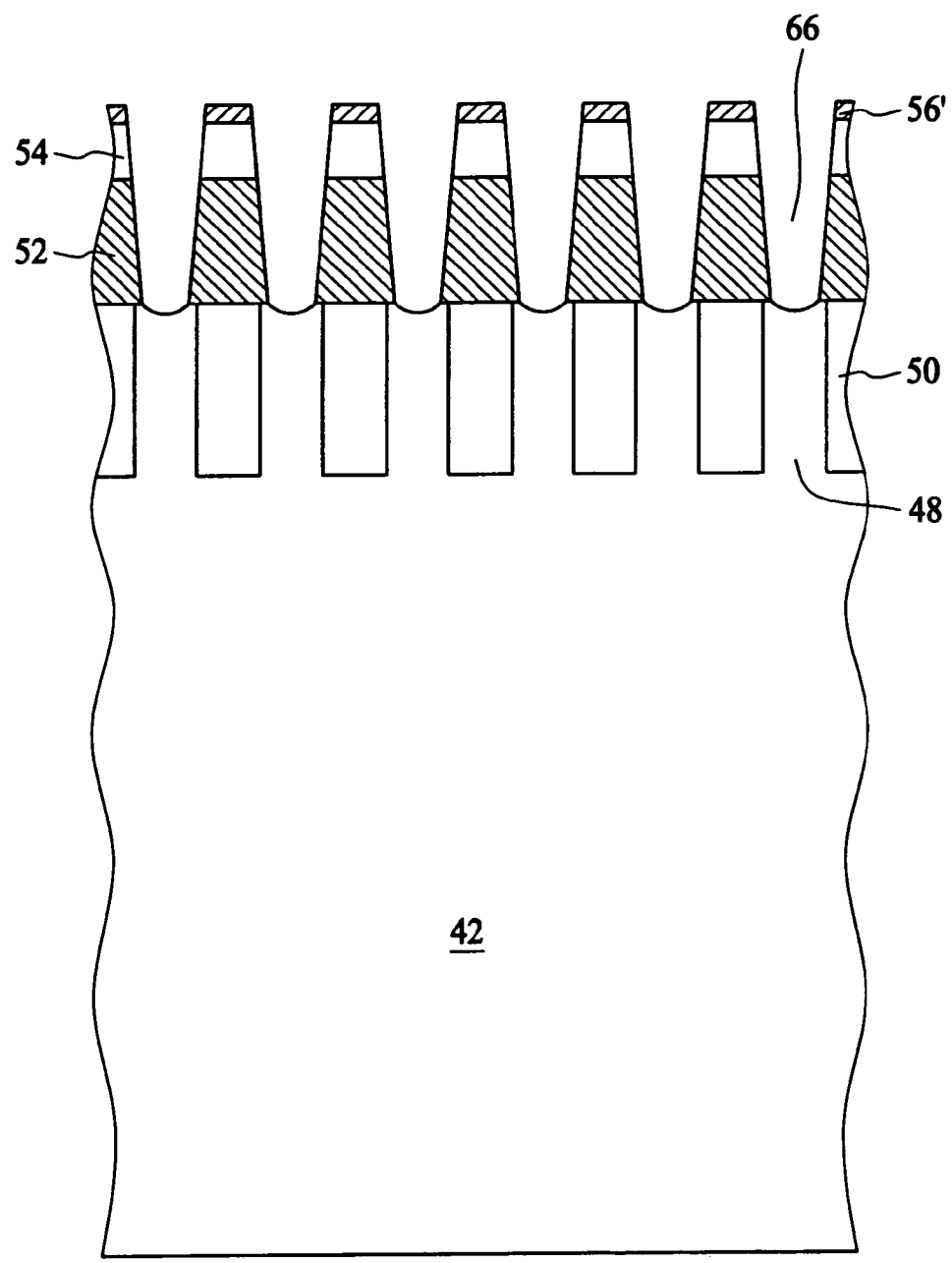

Referring to FIG. 6, an etching process is performed using the photoresist layer 60 as an etching mask to remove a portion of the anti-reflection layer 58 and the polysilicon 56, and the photoresist layer 60 is then removed to form a first mask 56' having a plurality of openings 64. Preferably, hydrogen bromide (HBr) is used as an etching gas to etch the polysilicon layer 56. Subsequently, another etching process is performed using the first mask 56' as an etching mask to remove a portion of the first dielectric layer 52 and the second dielectric layer 54 under the first openings 64 to form a plurality of first depressions 66 in the first dielectric layer 52, as shown in FIG. 7. Each first depression 66 exposes a doped region 48 serving as a source or a drain of the word line 46 functioning as a transistor, and a shallow trench isolation structure 50 surrounds the doped region 48 for electrical isolation.

Figure 8:
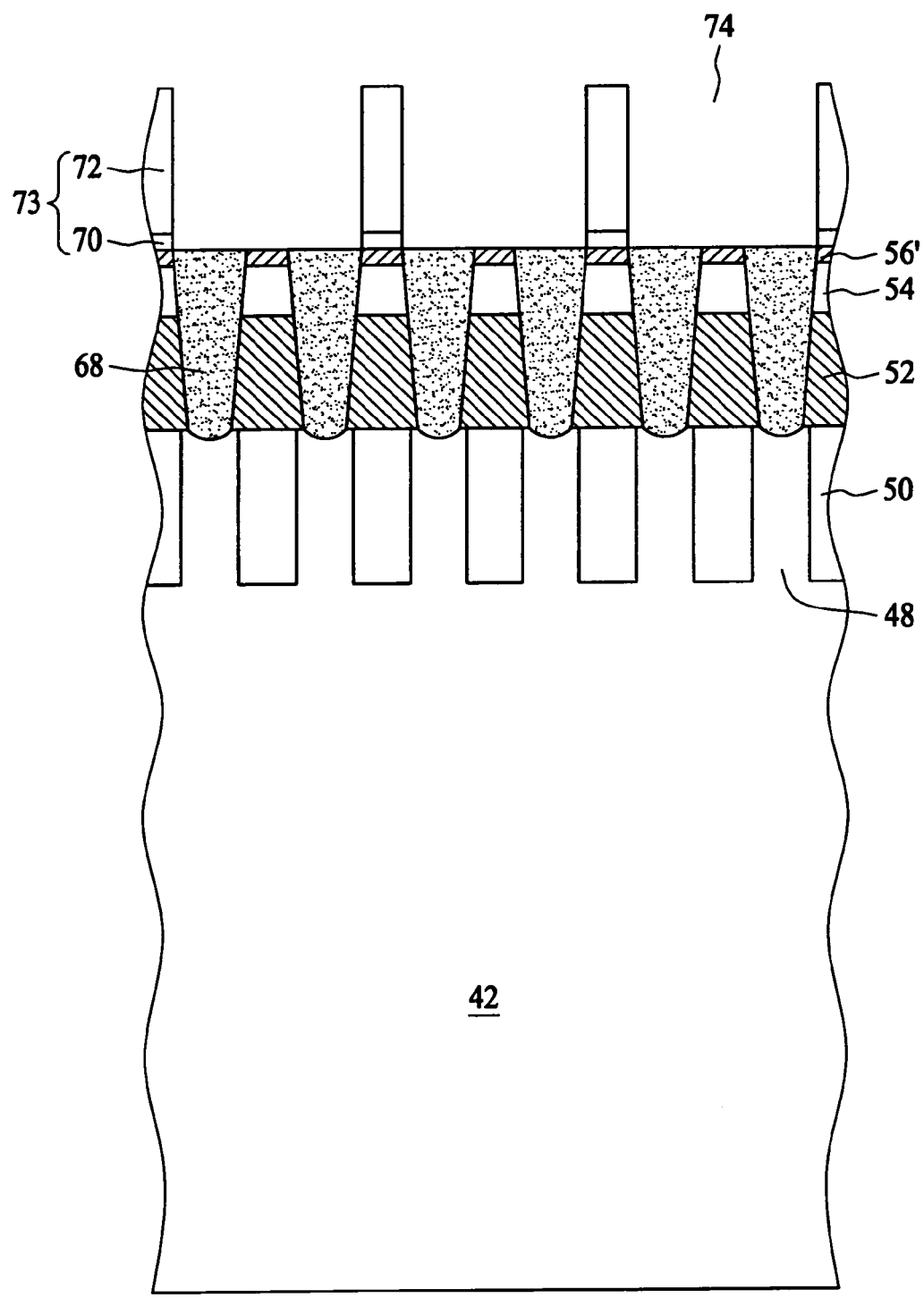

Referring to FIG. 8, the first depressions 66 are filled with organic material 68 by a coating process, wherein the organic material 68 may include propylene glycol, monomethyl ether acetate, photoactive compound (PAC) or novolak resin. A anti-reflection layer 70 is formed on the organic material 68 and the first mask 56', and a lithographic process is then performed to form a photoresist layer 72 having a plurality of openings on the anti-reflection layer 70. Subsequently, an etching process is performed using the photoresist layer 72 as an etching mask to remove a portion of the anti-reflection layer 70 under the openings in the photoresist layer 72 to form a second mask 73 having a plurality of openings 74 on the first mask 56', wherein the second mask 73 includes the photoresist layer 72 and the remaining anti-reflection layer 70.

Figure 9:
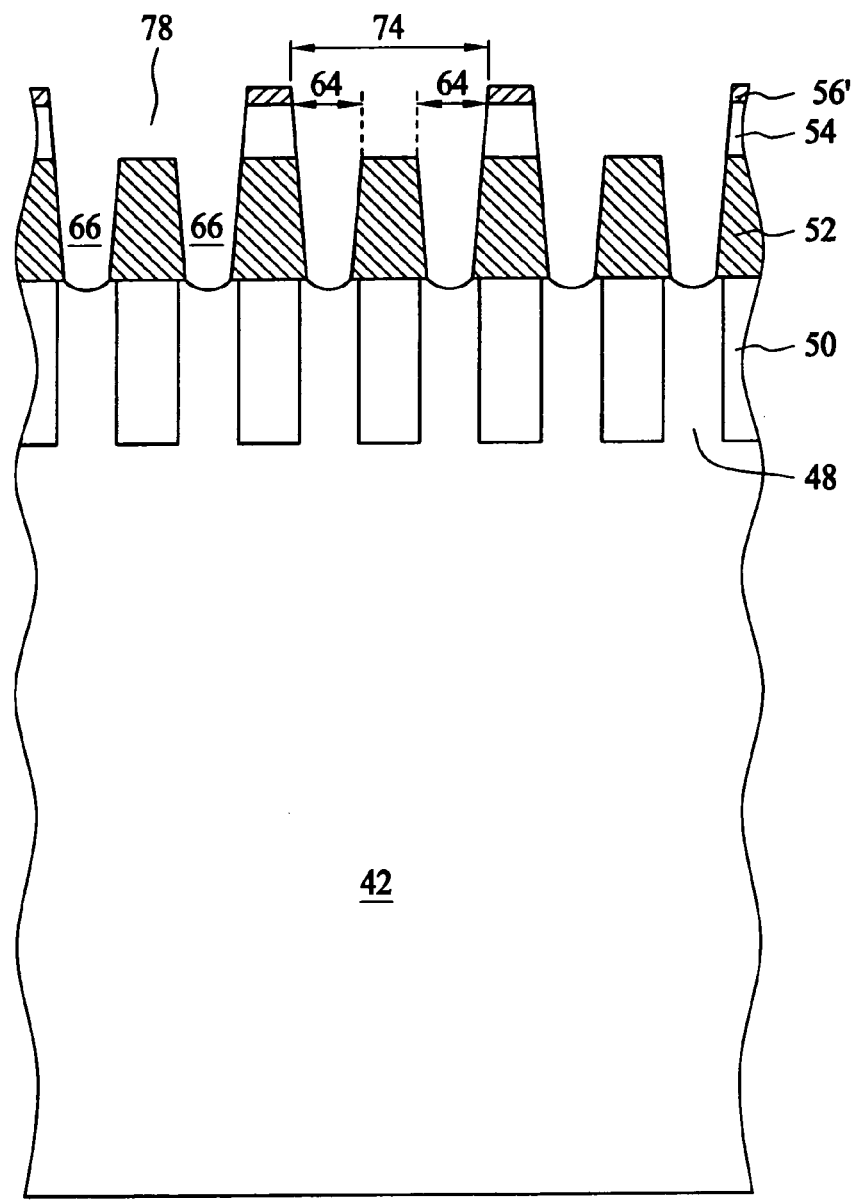

Referring to FIG. 9, an etching process is performed using the second mask 73 as an etching mask to remove a portion of the first mask 56', the second dielectric layer 54 and the organic material 68 under the openings 74 to form a plurality of second depressions 78 each connecting two first depressions 66, and the second mask 73 is then removed. Particularly, each opening 74 in the second mask 73 connects two openings 64 in the first mask 56'. 3-butadiene (C4F6) can be used as an etching gas to etch the portion of the second dielectric layer 54 and the first mask 56' under the openings 74. Further, the etching rate of the etching gas to the second dielectric layer 54 is substantially the same as that to the organic material 68 such that the etching process removes a portion of the organic material 68. The remaining organic material 68, probably filling up the first depression 66 in the first dielectric layer 52, can be removed entirely by oxygen-containing plasma.

Figure 10:
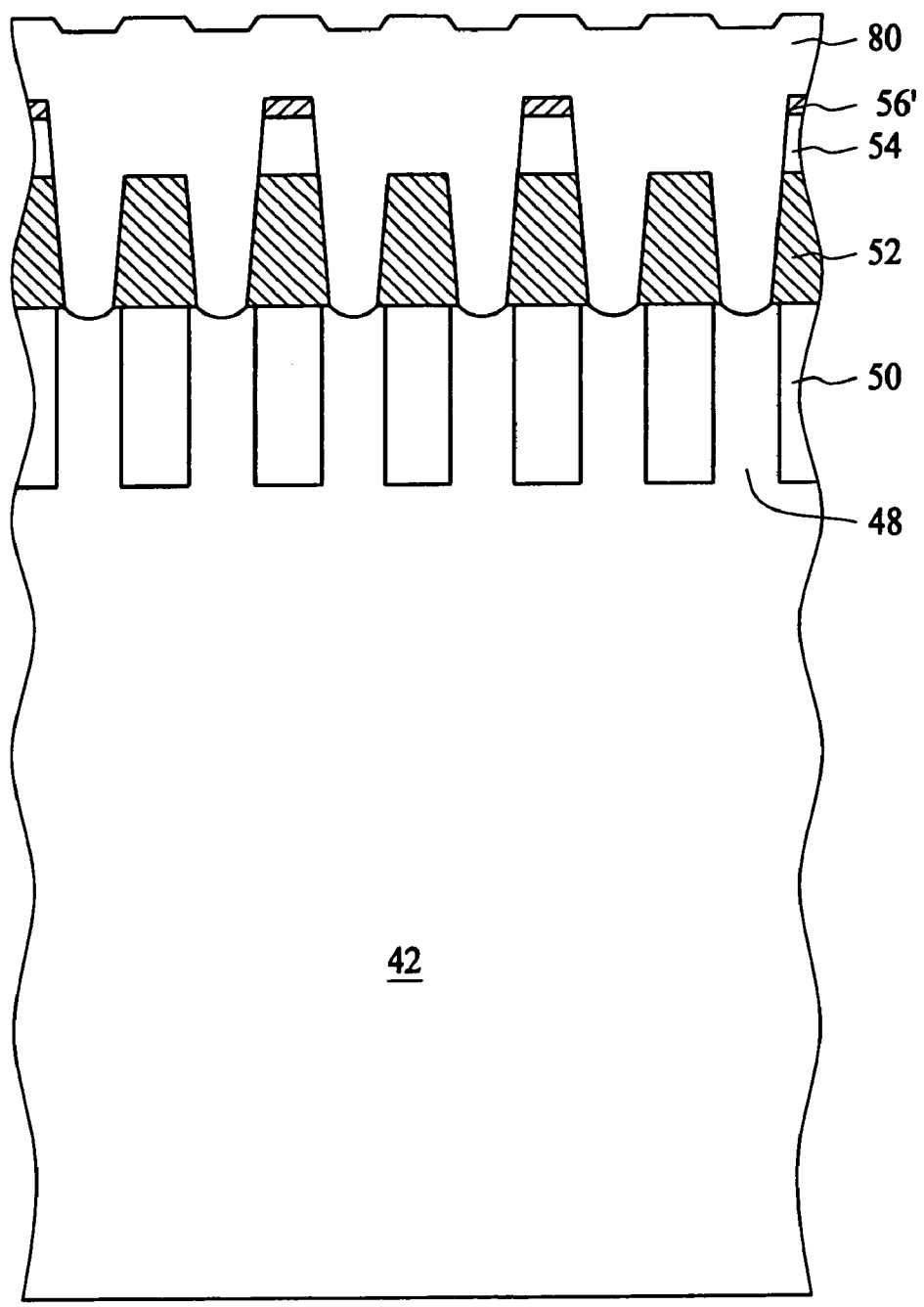

Referring to FIG. 10 and FIG. 11, a deposition process is performed to form a conductive layer 80 made of conductive material such as doped polysilicon, which fills the first depressions 66 and the second depression 78. Subsequently, a planarization process such as the chemical mechanical polishing (CMP) process is performed to remove the first mask 56' and a portion of the conductive layer 80 to form the contact plug structure 90 as shown in FIG. 11.

Figure 12:
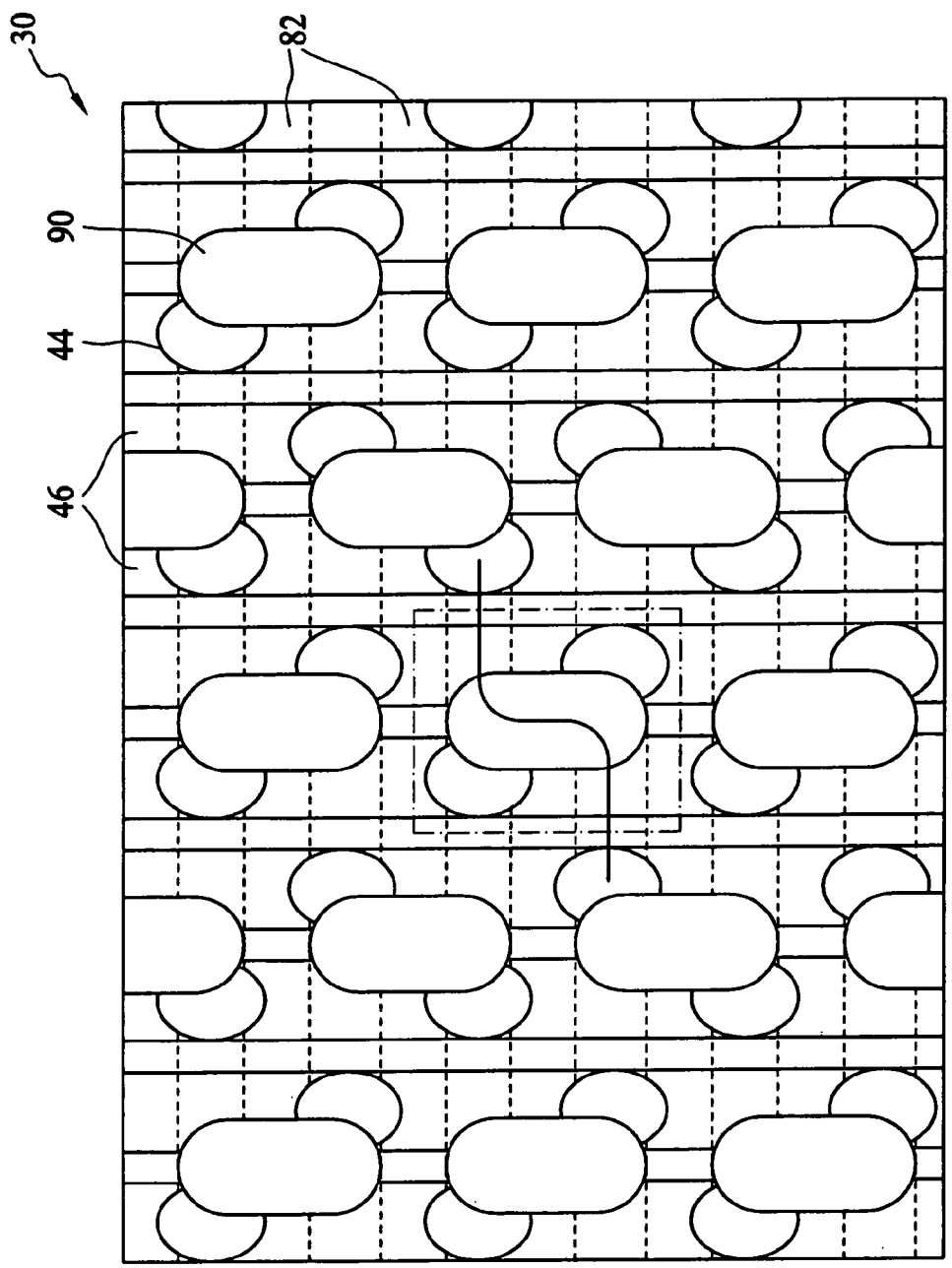
FIG. 12 is a top view of a checkerboard dynamic random access memory according to one embodiment of the present invention.
Figure 13:
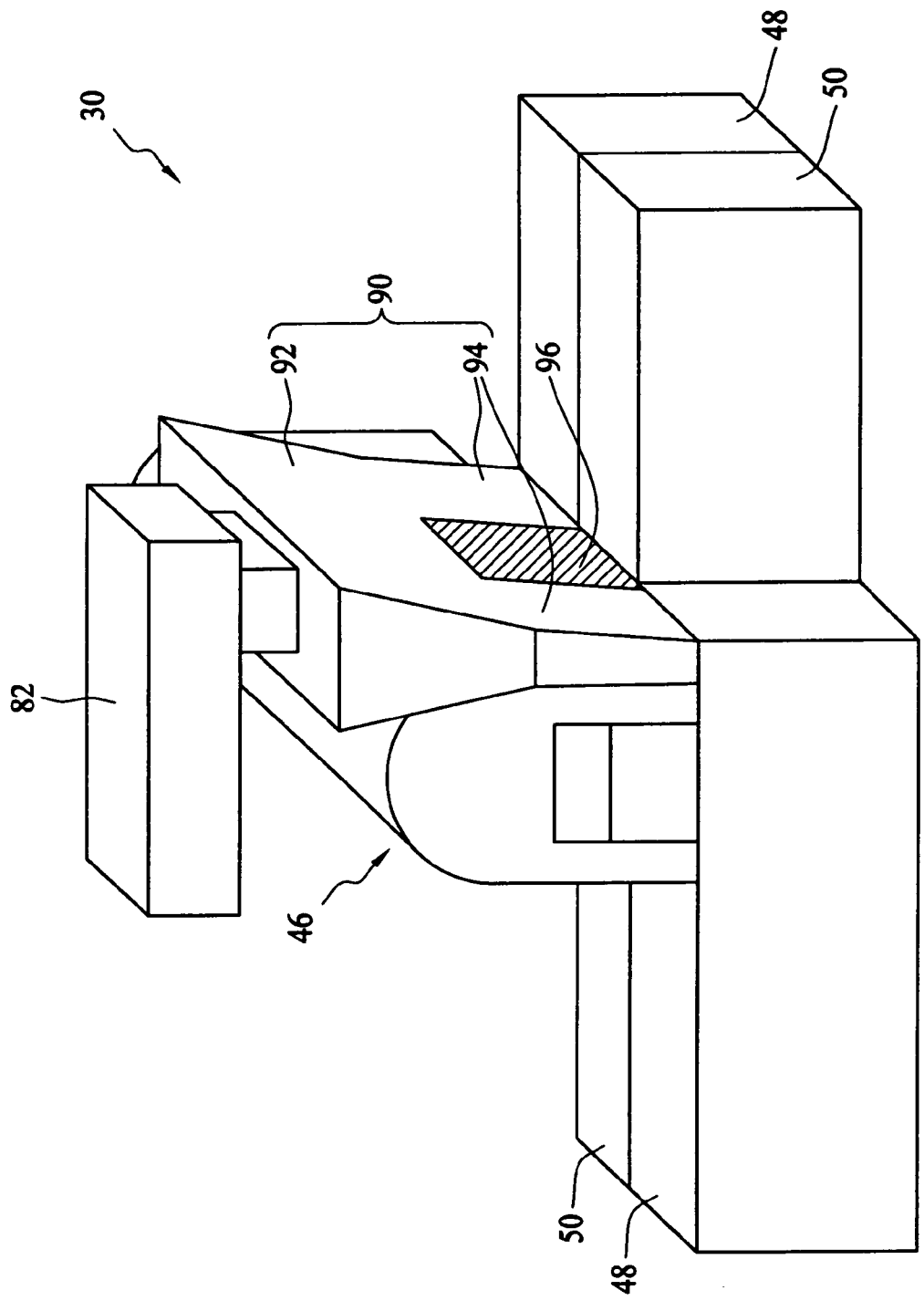
FIG. 13 is a close-up diagram of a checkerboard dynamic random access memory according to one embodiment of the present invention.

FIG. 12 is a top view of the checkerboard dynamic random access memory 30 according to one embodiment of the present invention and FIG. 13 is a close-up diagram of the checkerboard dynamic random access memory 30 according to one embodiment of the present invention. The contact plug structure 90 comprises a body portion 92, two leg portions 94 connected to the body portion 92, and a dielectric block 96 positioned between the two leg portions 94. Each leg portion 94 also electrically connects one doped region 48, and the dielectric block 96 consists of the first dielectric layer 52, as shown in FIG. 11. Preferably, the body portion 92 and the two leg portions 94 can be made of the same conductive material selected from the group consisting of polysilicon, doped polysilicon, tungsten, copper and aluminum, while the dielectric block 96 can be made of material selected from the group consisting of borophosphosilicate glass, silicon oxide, fluorinated silicate glass and low-k material. Consequently, a bit line 82 can connect to two doped regions 48 arranged in an S-shape manner with respect to the contact plug structure 90 via the contact plug structure 90, and further to two deep trench capacitors 44 arranged in an S-shape manner, as indicated by the S-shaped solid-line in FIG. 13.

Conventional contact plug structure 16 possesses serious bit line coupling due to extension over two doped regions 24 and one shallow trench isolation structure 22. In contrast, the contact plug structure 90 according to one aspect of the present invention uses two leg portions 94 to electrically connect two doped regions 48 arranged in an S-shape manner with respect to the contact plug structure 90, uses the body portion 92 to electrically connect the two leg portions 94 to the bit line 82, and isolates the two leg portions 94 from each other by the dielectric block 96. The word line 46 substantially overlaps with the two leg portions 94 of the contact plug structure 90 and the overall width of the two leg portions 94 of the contact plug structure 90 is substantially one third smaller than that of the conventional contact plug structure 16. Consequently, the contact plug structure 90 according to one aspect of the present invention can dramatically decrease the overlapped area between the bit line contact plug structure 90 and a word line 64 such that the bit line coupling can be effectively reduced The above-described embodiments of the present invention are intended to be illustrative only. Numerous alternative embodiments may be devised by those skilled in the art without departing from the scope of the following claims.

What is claimed is:

1. A method for preparing a contact plug structure, comprising the steps of:

forming a first mask having a plurality of first openings on a substrate including a silicon substrate having a shallow trench isolation structure surrounding a plurality of doped regions, a first dielectric layer positioned on the silicon substrate and a second dielectric layer positioned on the first dielectric layer;

removing a portion of the first dielectric layer and the second dielectric layer under the first openings to form a plurality of first depressions in the first dielectric layer, wherein the first depression exposes the doped region in the silicon substrate;

forming a second mask having a plurality of second openings on the substrate, each second opening connecting a plurality of the first openings;

removing a portion of the second dielectric layer under the second openings to form a plurality of second depressions in the second dielectric layer; and depositing a conductive layer in the first depressions and the second depressions to form the contact plug structure.

2. The method for preparing a contact plug structure of claim 1, wherein the first mask includes polysilicon.

3. The method for preparing a contact plug structure of claim 1, wherein the step of forming a first mask having a plurality of first openings on a substrate comprises:

forming a polysilicon layer on the substrate;

forming an anti-reflection layer on the polysilicon layer;

performing a lithographic process to form a photoresist layer having a plurality of third openings on the anti-reflection layer; and performing an etching process to remove a portion of the anti-reflection layer and the polysilicon layer under the third openings.

4. The method for preparing a contact plug structure of claim 3, wherein the anti-reflection layer includes organic material.

5. The method for preparing a contact plug structure of claim 1, wherein each second opening connects two first openings.

6. The method for preparing a contact plug structure of claim 1, wherein each second depression connects two first depressions.

7. The method for preparing a contact plug structure of claim 1, further comprising a step of filling organic material in the first depressions before forming a second mask having a plurality of second openings on the substrate.

8. The method for preparing a contact plug structure of claim 7, wherein the portion of the second dielectric layer under the second openings is removed by a dry etching process.

9. The method for preparing a contact plug structure of claim 8, wherein the dry etching process removes a portion of the organic material in the first depressions.

10. The method for preparing a contact plug structure of claim 8, further comprising a step of removing the organic material in the first depressions by oxygen-containing plasma.

11. The method for preparing a contact plug structure of claim 1, wherein the second mask includes a photoresist layer.

12. The method for preparing a contact plug structure of claim 11, wherein the second mask further includes an anti-reflection layer and the photoresist layer is positioned on the anti-reflection layer.

13. The method for preparing a contact plug structure of claim 1, wherein the second mask is positioned on the first mask.

* * * * *